(12) United States Patent
Chang et al.

(10) Patent No.: US 11,569,380 B2
(45) Date of Patent: Jan. 31, 2023

(54) SEMICONDUCTOR STRUCTURE

(71) Applicant: UNITED MICROELECTRONICS CORP., Hsin-Chu (TW)

(72) Inventors: Wei-Hsuan Chang, Tainan (TW); Ming-Hua Tsai, Tainan (TW); Chin-Chia Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/366,053

(22) Filed: Jul. 2, 2021

(65) Prior Publication Data
US 2023/0006062 A1 Jan. 5, 2023

(51) Int. Cl.
*H01L 29/78* (2006.01)
*H01L 29/45* (2006.01)

(52) U.S. Cl.
CPC ........ *H01L 29/7836* (2013.01); *H01L 29/458* (2013.01)

(58) Field of Classification Search
CPC combination set(s) only.
See application file for complete search history.

(56) References Cited

U.S. PATENT DOCUMENTS

| | | | |
|---|---|---|---|
| 7,932,581 B2 | 4/2011 | Yang | |
| 9,184,283 B2 | 11/2015 | Zhang | |
| 9,406,812 B1 | 8/2016 | Horch | |
| 2010/0044768 A1* | 2/2010 | Sadd | H01L 29/66825 438/257 |
| 2015/0137233 A1* | 5/2015 | Xue | H01L 29/0847 438/294 |
| 2020/0090981 A1* | 3/2020 | Donnelly | H01L 27/092 |

* cited by examiner

*Primary Examiner* — Julio J Maldonado
*Assistant Examiner* — Mohammad A Rahman
(74) *Attorney, Agent, or Firm* — Winston Hsu

(57) ABSTRACT

A semiconductor structure is provided, and the semiconductor structure includes a substrate, and an active area is defined thereon, a gate structure spanning the active area, wherein the overlapping range of the gate structure and the active area is defined as an overlapping region, and the overlapping region includes four corners, and at least one salicide block covering the four corners of the overlapping region.

12 Claims, 5 Drawing Sheets

SEMICONDUCTOR STRUCTURE

BACKGROUND OF THE INVENTION

1. Field of the Invention

The present invention relates to the field of semiconductor manufacturing processes, in particular to a semiconductor structure including salicide layer.

2. Description of the Prior Art

Field effect transistors are important electronic devices in the fabrication of integrated circuits, and as the size of the semiconductor device shrinks, fabrications of the transistors and interconnects have to be improved for fabricating transistors with smaller sizes and higher quality.

Conventionally, after forming the transistors, contact plugs are often utilized for interconnection purposes, in which the contact plugs are composed of conducting metals such as tungsten or copper to electrically connect the gate, source, and drain to upper level interconnect layers. Furthermore, salicide layers are often formed over the surface of the gate structure and the source/drain region to improve the Ohmic contact between the contact plugs and the gate structure and the source/drain region. For example, a self-align salicide (salicide) process has been widely utilized to fabricate the salicide layers. The salicide process, after forming a salicide block (SAB) layer over non-salicide regions that are defined by a layout pattern according to a design rule provided from clients, includes steps of disposing a metal layer comprised of cobalt, titanium, or nickel on a source/drain region and a gate structure, and performing a rapid thermal process (RTP), thus the metal layer reacts with the silicon contained within the gate structure and the source/drain region to form a metal salicide.

As mentioned above, the salicide is utilized to reduce contact resistance of diffusion regions in typical logic circuits. However, the applicant found that if salicide is excessively formed, it will easily lead to leakage current of the device. For example, FIG. 1 shows a top view of a transistor device. In the device shown in FIG. 1, a substrate 10 is provided, on which an active area AA is defined, a gate structure 12 spans the active area AA, the active areas AA on both sides of the gate structure 12 are defined as source regions 14 and drain regions 16, respectively, and a plurality of contact structures 22 are located on and electrically connected to the source regions 14 and drain regions 16. Generally, in order to reduce the resistance between the contact structure 22 and the source region 14/the drain region 16, a salicide layer 20 can be formed on the source region 14 and the drain region 16. However, the applicant has found that when salicide layer 20 is formed on the whole source region 14 and drain region 16, leakage current is easily generated at the interface between gate structure 12 and active area AA (especially at the corner A, the corner B, the corner C and the corner D shown in FIG. 1), which affects the device performance.

Therefore, there is a need for an improved semiconductor structure to solve the above problems.

SUMMARY OF THE INVENTION

In one aspect of the present invention, a semiconductor structure is provided, and the semiconductor structure includes a substrate, and an active area is defined thereon, a gate structure spanning the active area, wherein the overlapping range of the gate structure and the active area is defined as an overlapping region, and the overlapping region includes four corners, and at least one salicide block covering the four corners of the overlapping region.

To sum up, the present invention is characterized in that the shape of salicide block is designed so that salicide block covers at least the corners at the interface of the gate structure and the active area, but does not cover the long sides of both sides of the gate structure. In this way, the salicide layer formed later will not cover the corners at the interface of the gate structure and the active area, which can prevent the leakage current of the gate structure from flowing into the salicide layer. Therefore, the semiconductor structure with salicide layer of the present invention has the advantages of preventing leakage current, improving product yield, and being compatible with the existing process.

These and other objectives of the present invention will no doubt become obvious to those of ordinary skill in the art after reading the following detailed description of the preferred embodiment that is illustrated in the various Figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
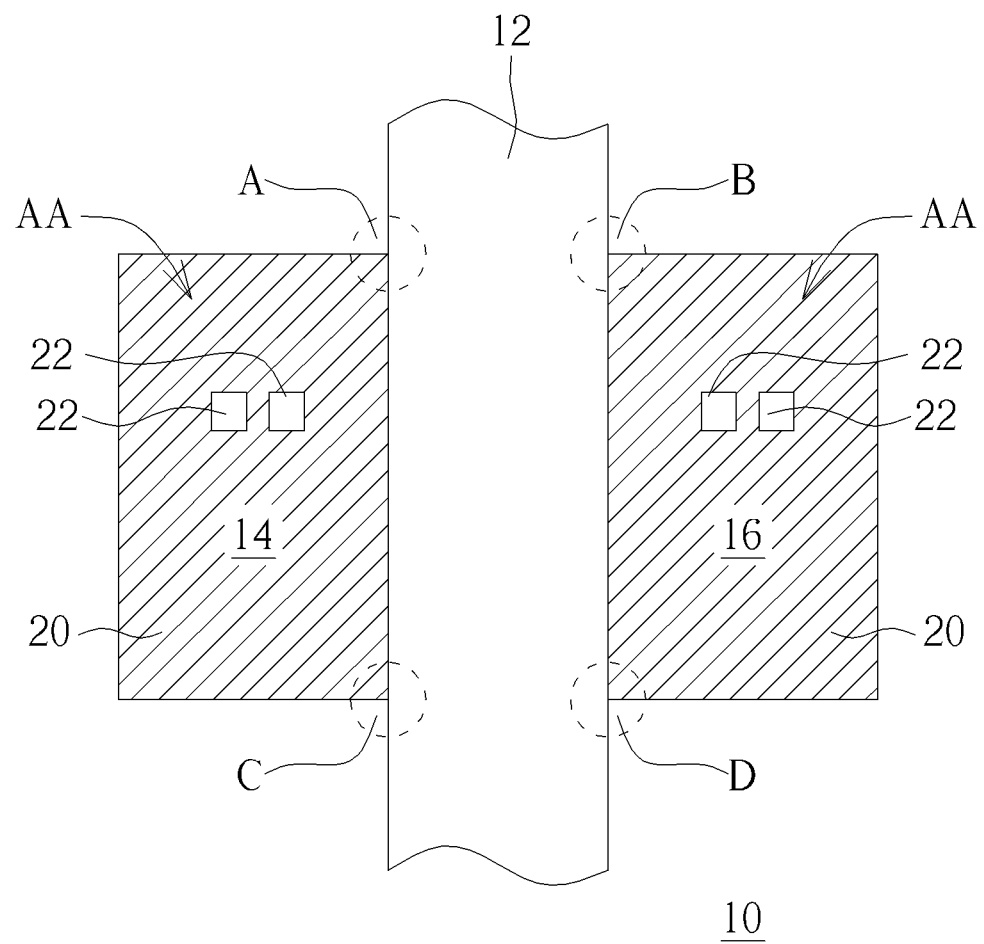
FIG. 1 shows a top view of a conventional transistor device.
Figure 2:
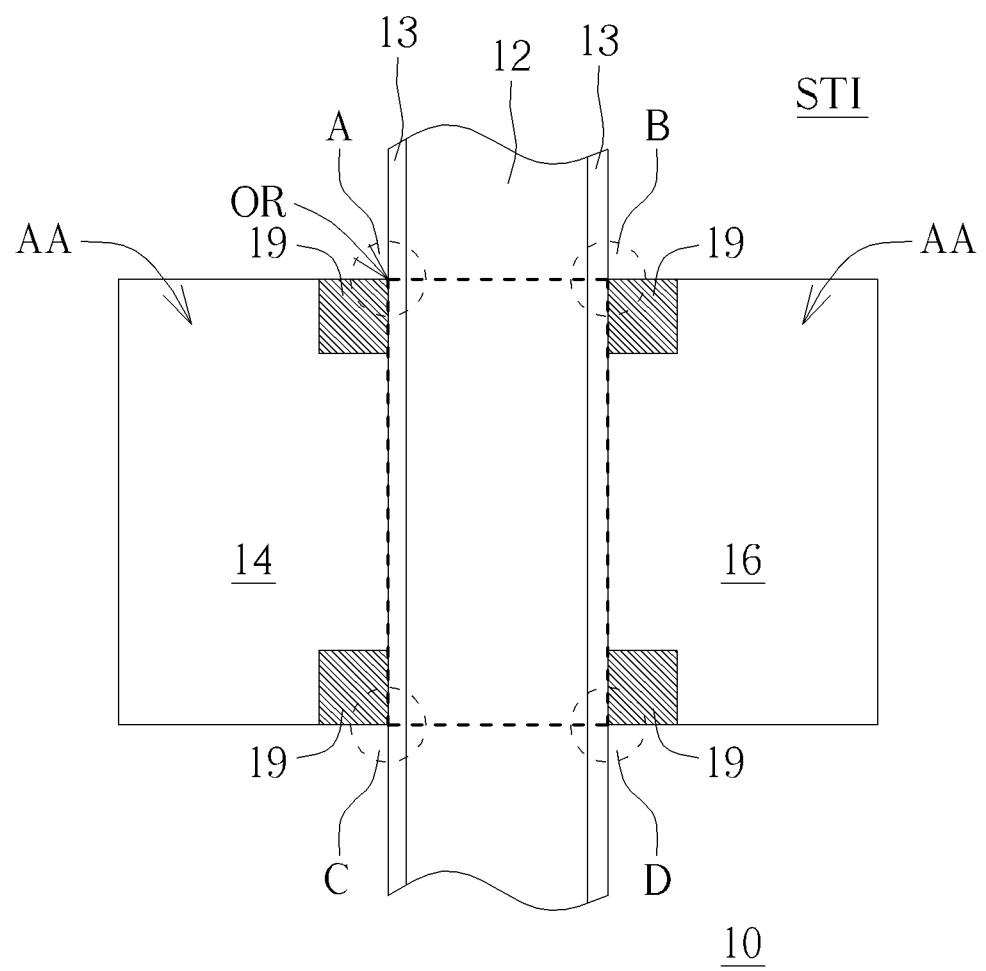
FIG. 2-3 shows a top view of a semiconductor structure according to the first preferred embodiment of the present invention.
Figure 3:
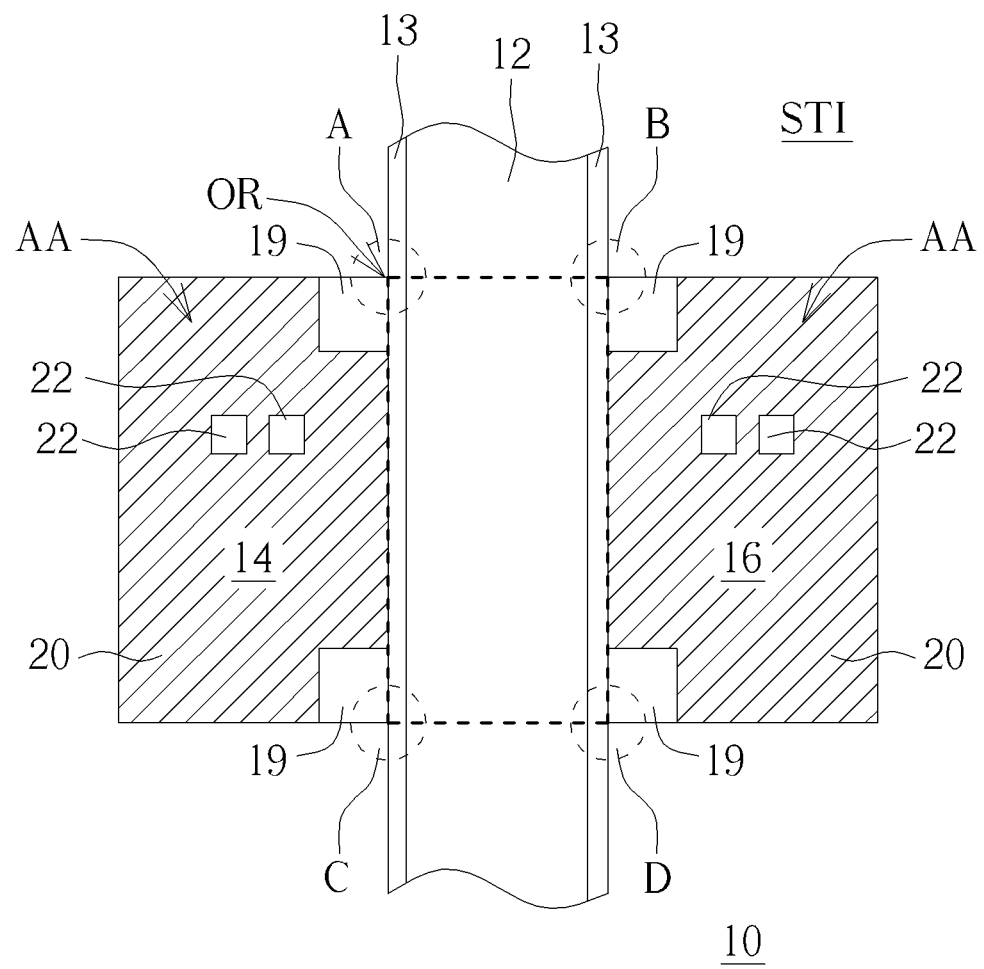

Please refer to FIG. 2-3. FIG. 2-3 shows a top view of a semiconductor structure according to the first preferred embodiment of the present invention. As shown in FIG. 2, in this embodiment, a substrate 10, such as a silicon substrate, is provided, on which an active area (AA) and a shallow trench isolation (STI) surrounding the active area are formed. The active area AA comprises the same material as the silicon substrate, and the shallow trench isolation STI comprises an insulating layer (such as silicon oxide). Then, a gate structure 12 is formed on the substrate 10, with spacers 13 beside the gate structure 12, and the active areas AA on both sides of the gate structure 12 are defined as a source region 14 and a drain region 16, respectively. The gate structure described here is not limited to polysilicon gate or metal gate, and the spacer 13 is an insulating material such as silicon oxide or silicon nitride. Until this step, it is similar to the structure described in the prior art (please refer to FIG. 1), in which the substrate 10, the active area AA, the shallow trench isolation STI, the gate structure 12, the source region 14, the drain region 16 and other components described here belong to the conventional technology in this field, and are not described in detail here.

Here, the overlapping range between the gate structure 12 and the active area AA is defined as an overlapping region OR, and the overlapping region OR includes four corners (corner A, corner B, corner C and corner D). As mentioned in the prior art paragraph, if salicide layer is directly and completely formed on the source region 14 and the drain region 16, salicide layer will also be formed at the corners (corners A to D) where the gate structure 12 overlaps with the active area AA. According to the applicant's observation, the salicide layer located at corner A-D is easy to generate leakage current. However, if the salicide layer is not formed on the source region 14 and the drain region 16, the Ohmic resistance cannot be reduced. Therefore, it is an object of the present invention that no salicide layer is formed at the corners (corners A to D) where the gate structure 12 overlaps with the active area AA, but salicide layer is still formed on the surfaces of the rest of the source region 14/the drain region 16. In order to achieve the above purpose, as shown in FIG. 2, after the source region 14 and the drain region 16 are formed, a salicide block (SAB) 19 is formed to cover at least the corners A to D. Then, a salicide process is performed to form a salicide layer 20 in the region except the salicide block 19. The salicide process mentioned above comprises forming a metal layer (such as cobalt, titanium, or nickel, etc.) and performing a heating step (RTP). The above salicide step belongs to the conventional technology in the field, and is not described in detail here.

It is worth noting that in the present invention, the salicide block 19 is designed to cover at least the corners A to D of the overlapping region OR. As shown in FIG. 2, the formed salicide block 19 has four patterns separated from each other, each of which is a rectangular pattern, covering one of the corners A to D respectively. In addition, in this embodiment, the total area of salicide block 19 is less than 1/10 of the total area of source region 14 and drain region 16, but it is not limited to this. Besides, the salicide block formed in the present invention can be formed together with other salicide block processes (for example, in the original process, salicide block was formed on devices such as resistors and I/O regions), so the salicide block formed in the present invention does not use additional steps.

Then, a salicide process is performed. As shown in FIG. 3, the salicide layer 20 is formed on the source region 14 and the drain region 16, but it is not formed at the corner A-D. Then, a contact structure 22 is formed on the salicide layer 20. The salicide layer 20 in this embodiment can reduce the interface resistance between the source region 14/the drain region 16 and the contact structure 22, but it is not located at the corner A-D, so the probability of leakage current caused by salicide being located at the corner can be reduced.

In addition, it is worth noting that although the salicide layer 20 in this embodiment does not cover the corners A-D, it will be located beside the long sides of the gate structure 12, that is, adjacent to the two long sides of the overlapping region OR. In other words, the salicide layer 20 in this embodiment directly contacts the spacer 13 on both sides of the middle part of the gate structure 12. According to the observation results of the applicant, when the salicide layer 20 is adjacent to the long sides of the gate structure 12, the control effect of the gate structure on electrical properties is better.

In other embodiments of the present invention, the shape of the salicide block 19 can be changed, so that salicide layer 20 with different shapes can be produced. The following paragraphs will illustrate different shapes of salicide layer in different embodiments of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 4:
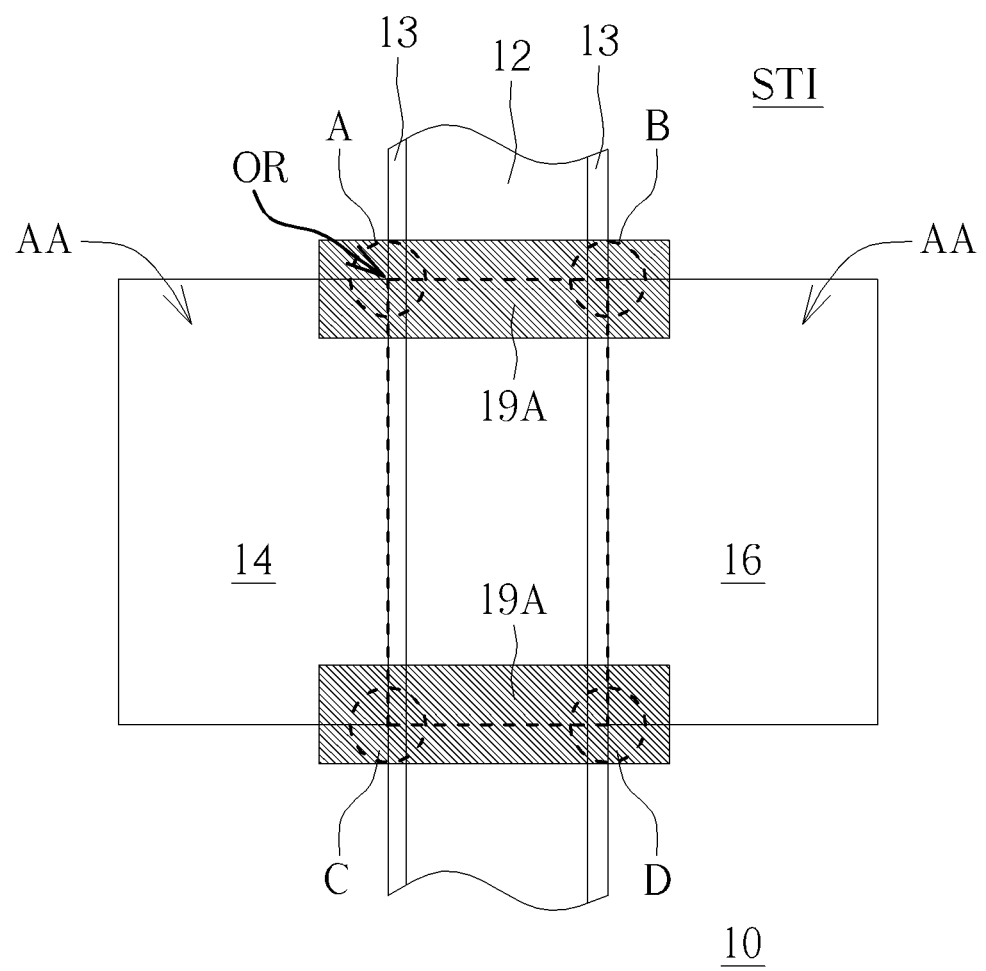
FIG. 4 shows a top view of a semiconductor structure according to another embodiment of the present invention.

In another embodiment of the present invention, as shown in FIG. 4, a salicide block 19A has a different shape from the salicide block 19 shown in FIG. 2. Furthermore, the salicide block 19A in this embodiment includes two patterns separated from each other, one pattern covering two corners (such as corner A and corner B) of the overlapping region OR, and the other pattern covering the other two corners (such as corner C and corner D) of the overlapping region OR, the two patterns are rectangular shape patterns, but not limited to this. In this embodiment, the shape of the salicide block is changed, so the shape of the salicide layer formed later will also be changed. However, it can be understood that the salicide layer in this embodiment still does not cover the corner A-D, thus reducing the probability of leakage current.

Figure 5:
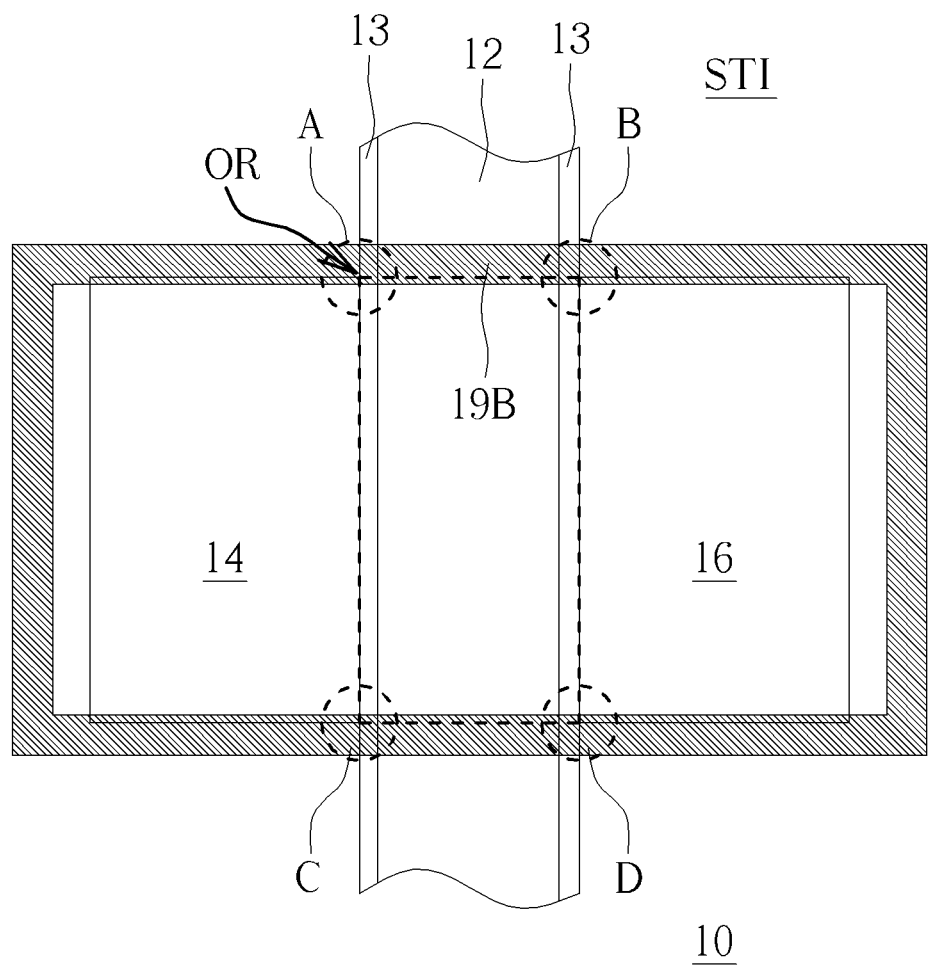
FIG. 5 shows a top view of a semiconductor structure according to another embodiment of the present invention.

In another embodiment of the present invention, as shown in FIG. 5, a salicide block 19B has a different shape from the salicide block 19 shown in FIG. 2. Furthermore, in this embodiment, salicide block 19B includes a frame shape pattern covering the four corners of the overlapping region, but it is not limited to this. In this embodiment, the shape of the salicide block is changed, so the shape of the salicide layer formed later will also be changed. However, it can be understood that the salicide layer in this embodiment still does not cover the corner A-D, thus reducing the probability of leakage current.

In one aspect of the present invention, a semiconductor structure is provided, and the semiconductor structure includes a substrate, and an active area is defined thereon, a gate structure spanning the active area, wherein the overlapping range of the gate structure and the active area is defined as an overlapping region, and the overlapping region includes four corners, and at least one salicide block covering the four corners of the overlapping region.

In some embodiment of the present invention, the overlapping region includes two long sides, and the salicide block does not cover a middle part of the two long sides.

In some embodiment of the present invention, the salicide block includes four patterns separated from each other, and wherein the four patterns covers the four corners of the overlapping region respectively.

In some embodiment of the present invention, the four patterns are rectangular shape patterns.

In some embodiment of the present invention, the salicide block comprises two patterns separated from each other, one pattern covering two corners of the overlapping region and the other pattern covering the other two corners of the overlapping region.

In some embodiment of the present invention, the two patterns are rectangular shape patterns.

In some embodiment of the present invention, the salicide block includes a pattern covering the four corners of the overlapping region.

In some embodiment of the present invention, the pattern is a frame shape pattern.

In some embodiment of the present invention, further comprising two spacers disposed on both sides of the gate structure, and the salicide block contacts part of the spacers and covers part of the active area.

In some embodiment of the present invention, the active area on both sides of the gate structure is defined as a source/drain region, and further comprising at least one contact structure located on the source/drain region.

In some embodiment of the present invention, further comprising at least one salicide layer disposed on the source/drain region, wherein the salicide layer does not overlap with the four corners of the overlapping region.

In some embodiment of the present invention, the area of each salicide block is less than 1/10 of the area of the source/drain region.

In some embodiment of the present invention, parts of the salicide layer directly contacts the two spacers which is disposed on both sides of the gate structure in a middle part of the gate structure.

To sum up, the present invention is characterized in that the shape of salicide block is designed so that salicide block covers at least the corners at the interface of the gate structure and the active area, but does not cover the long sides of both sides of the gate structure. In this way, the salicide layer formed later will not cover the corners at the interface of the gate structure and the active area, which can prevent the leakage current of the gate structure from flowing into the salicide layer. Therefore, the semiconductor structure with salicide layer of the present invention has the advantages of preventing leakage current, improving product yield, and being compatible with the existing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate, and an active area is defined thereon;
   a gate structure spanning the active area, wherein the overlapping range of the gate structure and the active area is defined as an overlapping region, and the overlapping region includes four corners;
   at least one salicide block covering the four corners of the overlapping region; and
   two spacers disposed on both sides of the gate structure, wherein the salicide block contacts part of the two spacers and covers part of the active area, and the remaining part of the two spacers does not contact the salicide block.

2. The semiconductor structure according to claim 1, wherein the overlapping region comprises two long sides, and the salicide block does not cover a middle part of the two long sides.

3. The semiconductor structure according to claim 1, wherein the salicide block comprises four patterns separated from each other, and wherein the four patterns covers the four corners of the overlapping region respectively.

4. The semiconductor structure according to claim 3, wherein the four patterns are rectangular shape patterns.

5. The semiconductor structure according to claim 1, wherein the salicide block comprises two patterns separated from each other, one pattern covering two corners of the overlapping region and the other pattern covering the other two corners of the overlapping region.

6. The semiconductor structure according to claim 5, wherein the two patterns are rectangular shape patterns.

7. The semiconductor structure according to claim 1, wherein the salicide block comprises a pattern covering the four corners of the overlapping region.

8. The semiconductor structure according to claim 7, wherein the pattern is a frame shape pattern.

9. The semiconductor structure according to claim 1, wherein the active area on both sides of the gate structure is defined as a source/drain region, and further comprising at least one contact structure located on the source/drain region.

10. The semiconductor structure according to claim 9, further comprising at least one salicide layer disposed on the source/drain region, wherein the salicide layer does not overlap with the four corners of the overlapping region.

11. The semiconductor structure according to claim 9, wherein the area of each salicide block is less than 1/10 of the area of the source/drain region.

12. The semiconductor structure according to claim 9, wherein parts of the salicide layer directly contacts the two spacers which is disposed on both sides of the gate structure in a middle part of the gate structure.

* * * * *